(12) United States Patent
Ali et al.

(10) Patent No.: US 6,362,966 B1
(45) Date of Patent: *Mar. 26, 2002

(54) PROTECTIVE COVER AND PACKAGING FOR MULTI-CHIP MEMORY MODULES

(75) Inventors: Ihab A. Ali, San Francisco, CA (US); Shawn S. McEuen, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/311,655

(22) Filed: May 13, 1999

(51) Int. Cl.$^7$ .................................................. H05K 7/00
(52) U.S. Cl. ........................ 361/728; 361/752; 361/759; 174/252; 174/35 R; 174/52.4; 257/704; 257/707; 257/718; 257/719
(58) Field of Search ................................. 361/381, 704, 361/752, 824, 796, 720, 728, 759, 800–801, 719, 816, 818; 174/66, 252, 35 R, 52.3–52.4, 50; 257/433, 723, 704, 707, 718–719; 438/108; 437/205

(56) References Cited

U.S. PATENT DOCUMENTS

| | | | | |
|---|---|---|---|---|
| 4,730,232 A | * | 3/1988 | Lindberg | 361/381 |
| 5,536,905 A | * | 7/1996 | Redman et al. | 174/36 GC |
| 5,708,297 A | * | 1/1998 | Clayton | 257/723 |
| 5,723,363 A | * | 3/1998 | Wiese | 437/205 |
| 5,893,726 A | * | 4/1999 | Farnworth et al. | 438/108 |
| 6,083,026 A | * | 7/2000 | Trout et al. | 439/328 |
| 6,088,228 A | * | 7/2000 | Petersen et al. | 361/720 |
| 6,160,711 A | * | 12/2000 | Gerrits et al. | 361/737 |

* cited by examiner

Primary Examiner—Jeffrey Gaffin
Assistant Examiner—Thanh Y. Tran
(74) Attorney, Agent, or Firm—Blakely, Sokoloff, Taylor & Zafman LLP (57) ABSTRACT

A memory module having a packaging cover to encapsulate a board having multiple separate chips, which dynamically generate varying amounts heat. The packaging cover provides localized heat dissipation among the multiple separate memory chips. The separate chips are interconnected to the board via a set of solder balls. The packaging cover further provides a rigid encapsulation of the board and chips. In one embodiment, the memory module includes a thermally conductive substance displaced within the packaging cover to conduct heat from the separate chips to the packaging cover. In one embodiment, a top cover and bottom cover of the packaging cover are assembled with a separate frame to secure a coupling between the top and bottom covers of the packaging cover. In one embodiment, the frame includes grooves to receive notches of a module connector coupled to a motherboard. In one embodiment, the frame includes an aperture for receiving connections to thermal solutions external to the packaging cover.

23 Claims, 9 Drawing Sheets

PROTECTIVE COVER AND PACKAGING FOR MULTI-CHIP MEMORY MODULES

FIELD OF THE INVENTION

The present invention relates to a protective cover and packaging method for multiple memory chips on a circuit board.

BACKGROUND OF THE INVENTION

In the field of memory modules, memory chips are typically individually encapsulated in a protective package to protect the chip surface because it is susceptible to mechanical damages. In addition, the memory chips are interconnected to a circuit board through the use of leads, providing a secure interconnection between the chips and the circuit board.

Recently, however, the memory chips of memory modules are not individually encapsulated. Rather, the surfaces of the chips are exposed. As a result, leads are not used to interconnect the chips to the circuit board. In place of the leads, alternative techniques are used to interconnect the chips and the circuit board, which are typically more fragile than conventional leads.

As a result, the interconnection between the chips and the circuit board is very fragile and susceptible to mechanical damages. Therefore, there is a need for a protective packaging for memory chips to protect the exposed surface of the chips, and to protect the fragile interconnection between the chips and circuit board.

In addition, new memory devices, such as Rambus® RDRAM memory devices, allow the separate memory chips of the module to have varying functionality states (e.g., active, active/idle, standby, nap or inactive.) As a result, the separate chips of a module may consume varying amounts of power and therefore generate varying amounts of heat. Moreover, the different amounts of heat generated by the separate chips will change dynamically in a time dependent fashion.

For example, a first chip may generate more heat when it is in an active state, and sometime later may generate less heat when in an inactive state, while a second chip on the module generates more heat. As a result, there is a further need for a protective multi-chip memory module packaging that is able to dissipate heat from the chips of a memory module, wherein the separate chips generate varying amounts of heat, which changes dynamically among the chips.

Furthermore, the chips within a multi-chip memory module may have varying height tolerances. Therefore, the protective packaging should also accommodate for the potential variances in the height among the multiple memory chips of a memory module.

SUMMARY OF THE INVENTION

The present invention provides packaging cover to encapsulate a board having multiple separate chips, wherein the separate chips dynamically generate varying amounts heat.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

In one embodiment, the present invention provides a packaging cover for a multi-chip memory module having multiple memory chips mounted on a circuit board, wherein the memory chips are not individually packaged, and the memory chips may dynamically generate varying amounts of heat. As a result, the packaging cover of the present invention spreads localized heat sources from one or more of the memory chips into a larger conductive surface area. In addition, the packaging cover of the present invention provides greater protection from mechanical loads, such as compressive and shear stresses.

In the following description, numerous details are set forth. It will be apparent, however, to one skilled in the art, that the present invention may be practiced without these specific details. In other instances, well-known structures and devices are shown in block diagram form, rather than in detail, in order to avoid obscuring the present invention. For example, the protective packaging cover of the present invention could be used for the packaging of chips other than memory chips, without departing from the scope of the present invention.

Figure 1:
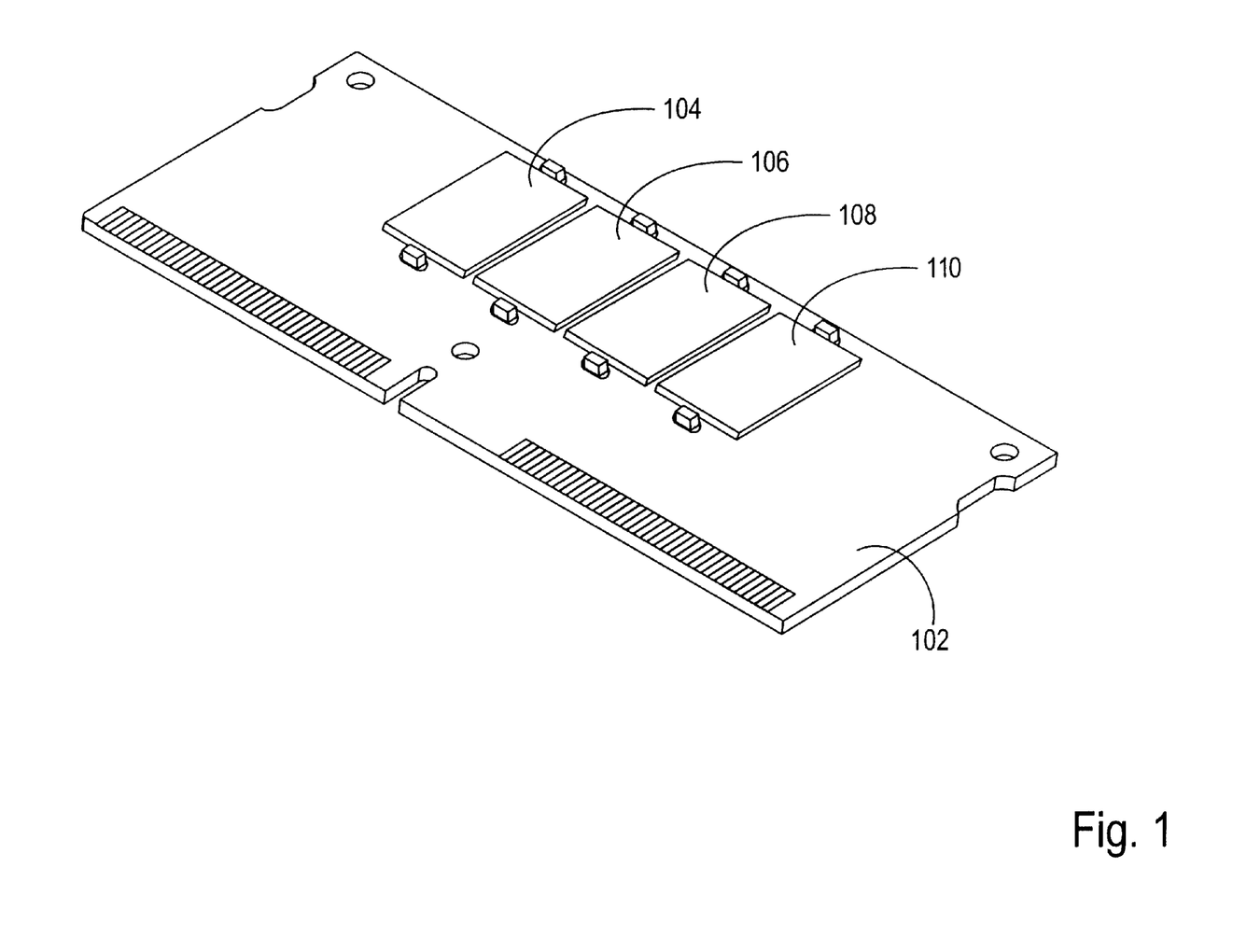
FIG. 1 illustrates a memory module card that may be encapsulated with the packaging cover according to one embodiment of the present invention.

FIG. 1 illustrates a memory module card that may be encapsulated with the packaging cover of the present invention. As shown, the circuit board 102 has multiple memory chips 104–110 attached to the board. The activity state of the memory chips could vary with respect to each other, as is described in the background. For example, chip 104 could be active at one moment, while chip 108 is inactive at the same time. Therefore, chip 104 may be consuming more power and generating more heat than chip 108. Later in time, chip 108 may be active and generating more heat than chip 104.

In addition, as shown the surfaces of he chips are exposed, i.e., not individually encapsulated. As a result, the surfaces of the chips are exposed to pressures and scratches. Moreover, in one embodiment, the chips are attached to the circuit board 10 via the use of micro solder balls. The use of micro solder balls to attach the chips to the circuit board typically provides a very fragile attachment to the board, and therefore further increases the need for greater protection of the memory module.

Figure 2A:
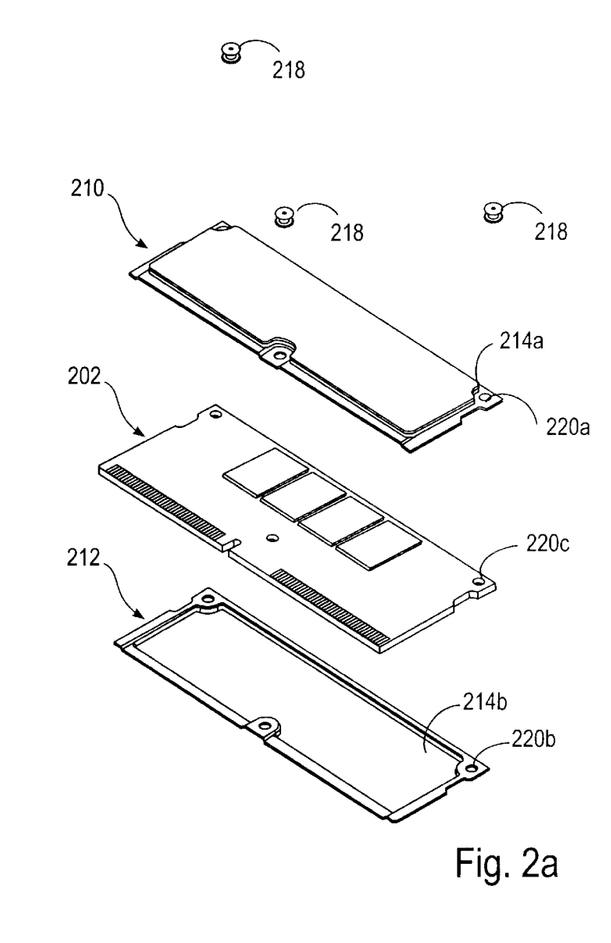
FIGS. 2a–2c illustrate one embodiment of the packaging covering of the present invention.
Figure 2B:
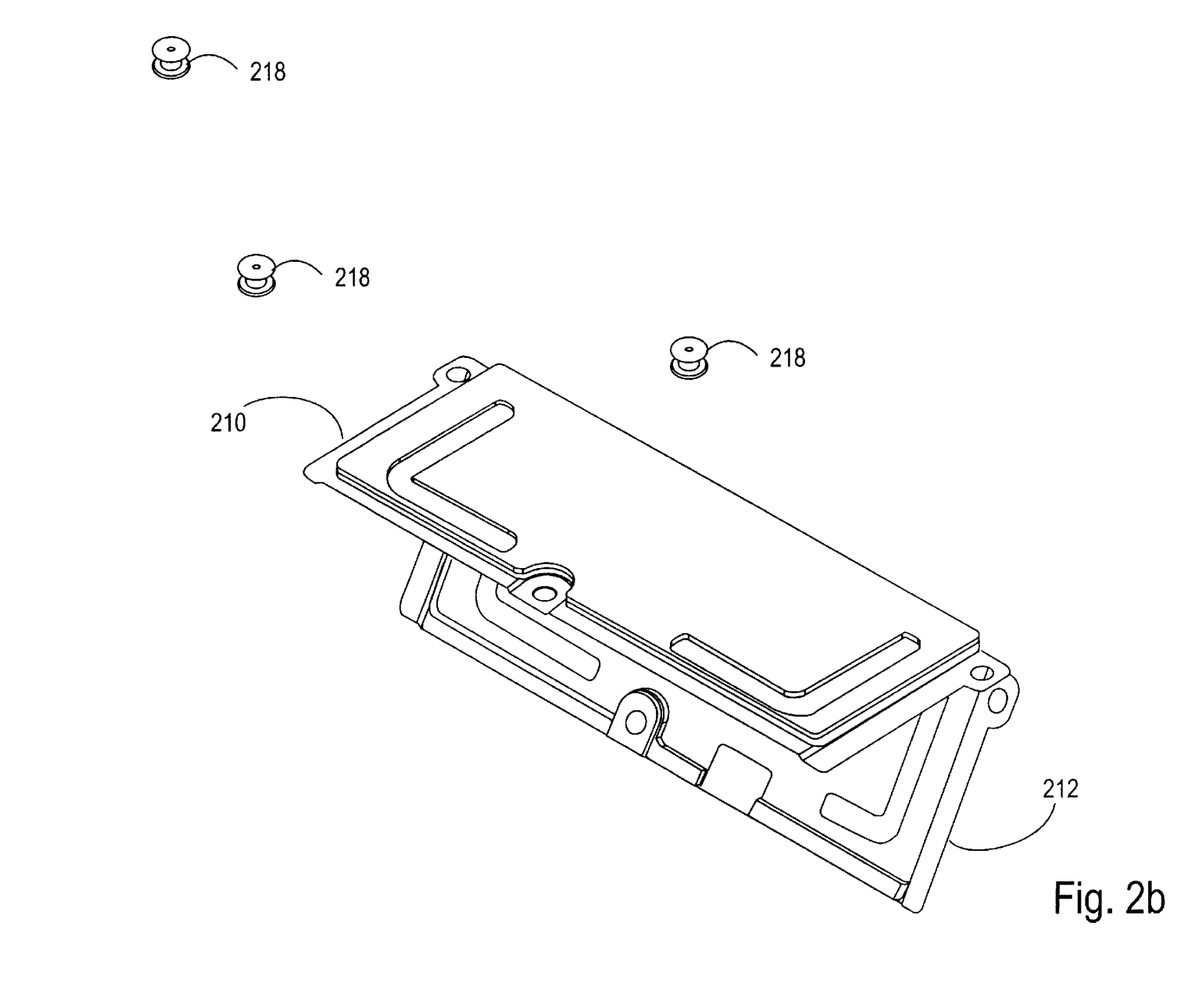

FIG. 2a illustrates one embodiment of the packaging covering of the present invention. As shown the packaging includes a top cover 210 and a bottom cover 212. The top and bottom covers each have a size large enough to cover/ encapsulate the chips 204–210 on the circuit board 202. In the case of chips being placed on both sides of the circuit board, the top and bottom covers will cover/encapsulate the chips on both sides. In one embodiment, as shown in FIG. 2a, the top cover 210 and bottom cover 212 may be separate pieces. In an alternative embodiment, illustrated in FIG. 2b the packaging cover may be one piece with the top cover 210 and bottom cover joined 212, forming an integral piece.

In one embodiment, as further illustrated in FIG. 2a, the covers of the package include a raised area 214a–214b in the center of the cover. The raised area allows for the border of the covers to be in flush contact with the board (or the opposite cover,) while providing height in the center of the cover to avoid contact between the chips and the covers. Furthermore, the raised areas within the center of the covers also allow for a height tolerance among the separate chips attached to the board (i.e., the chips may vary in height.) In one embodiment, the raised area of the chip cover has a height of 1.05±0.05 mm.

In one embodiment, a thermally conductive substance may be injected between the chips attached to the board and the inner surface of the package covers. In one embodiment, the thermally conductive substance may include a polymer-based gel. The thermally conductive gel provides a thermal coupling between the memory chips and the inner surface of the packaging cover. Moreover, in addition to providing the thermal coupling, the thermally conductive gel is sufficiently compliant to allow for varying heights among the separate chips. In on embodiment, the gel may be injected and attached to either the inner surface of the packaging cover, or alternatively, directly on the die surfaces before the package cover is assembled to the memory module.

Figure 2C:
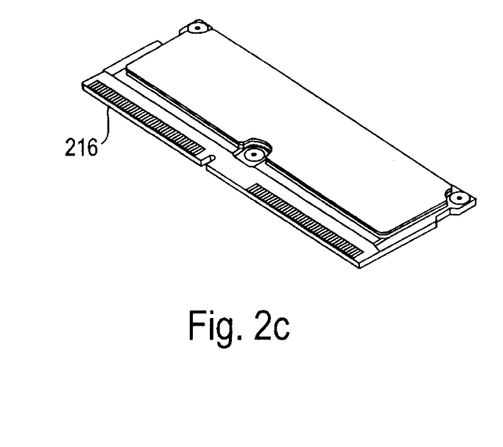

In one embodiment, as illustrated in FIG. 2c when the top cover and bottom cover of the packaging are assembled (by being placed in flush contact with the circuit board or in contact with the opposing cover) a seal is formed encapsulating the memory chips and conductive gel within the package. As shown in FIG. 2c, the connectors 216 of the board are left exposed outside of the package to interconnect the memory module into a socket of a motherboard.

The packaging cover may be made of either plastic material or metal material. The packaging cover may also be made of other materials without departing from the scope of the invention. In an embodiment using top and bottom covers made of metal material, the surface of the covers may act as a heat sink mechanism in spreading localized heat sources from one or more of the chips into the larger conductive surface area of the packaging cover.

FIG. 3 illustrates an embodiment using top and bottom covers made of plastic material. In the embodiment shown in FIG. 3, the raised areas of the top 310 and bottom 312 covers include a sheet-metal insert 340. The sheet-metal insert 340 acts as a heat sink mechanism in spreading localized heat sources from one or more of the chips into the larger conductive surface area of the sheet-metal surface. Alternatively, the top and bottom covers may be used without a sheet metal inserts for selected modules (e.g., low power modules.)

Moreover, the covers made of plastic material further provide additional surface area to receive attachments to thermal solutions external to the packaging cover. For example, the covers may include apertures (e.g., threads) to interconnect the covers to an external system-level thermal plate solution, to dissipate heat generated by the chips of the module.

The packaging cover (plastic or metal) of the present invention further consists of a rigid form. As a result, the rigidity of the packaging cover further protects the memory chips against mechanical loads including tensile, compressive and shear stresses. The rigidity and size of the package cover also helps to increase the surface area of any concentrated load/force such that the induced mechanical stresses are minimized.

In addition, there are a variety of mechanisms to attach together the separate covers of the packaging cover of the present invention. One embodiment, as further shown in FIGS. 2a & 2b, includes using rivets 218 pierced through aligned wholes 220a–220b of the top cover, circuit board, and bottom cover.

Figure 4:
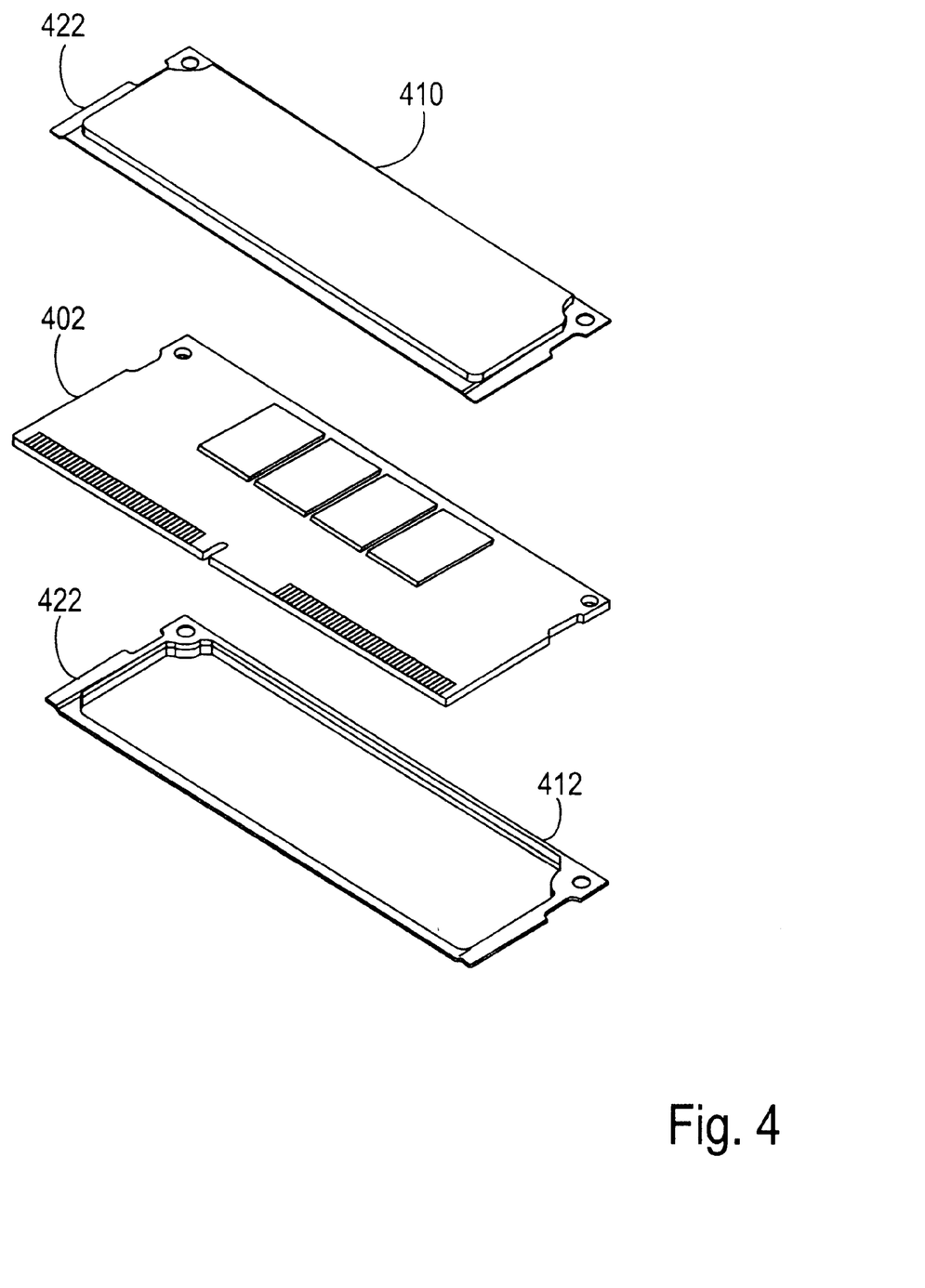
FIG. 4 illustrates a method for attaching top and bottom covers according to one embodiment of the present invention.

Alternatively, as illustrated in FIG. 4, in place of the rivets (or used with the rivets), an adhesive material (e.g., glue) may be placed on a flat outer rim 422 of the top 410 and bottom 412 covers. The adhesive material may be used to connect the covers to the circuit board, or, alternatively, connect the opposing covers to each other, with the circuit board displaced between the top and bottom covers.

Figure 5A:
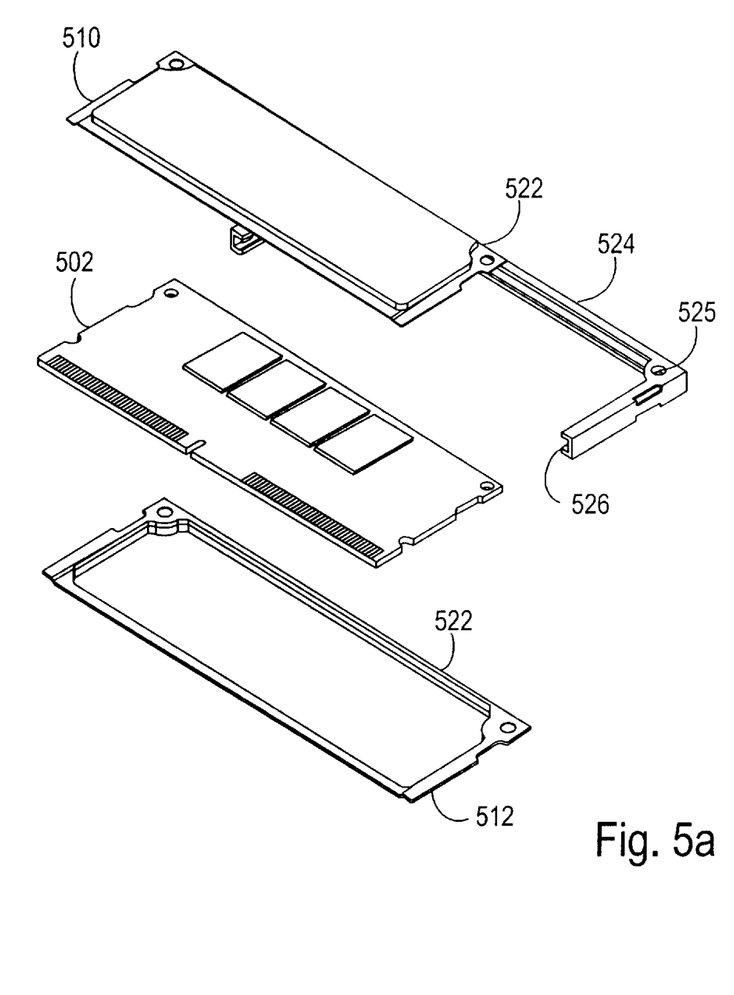
FIG. 5 illustrates an alternative method for attaching top and bottom covers according to one embodiment of the present invention.
Figure 5B:
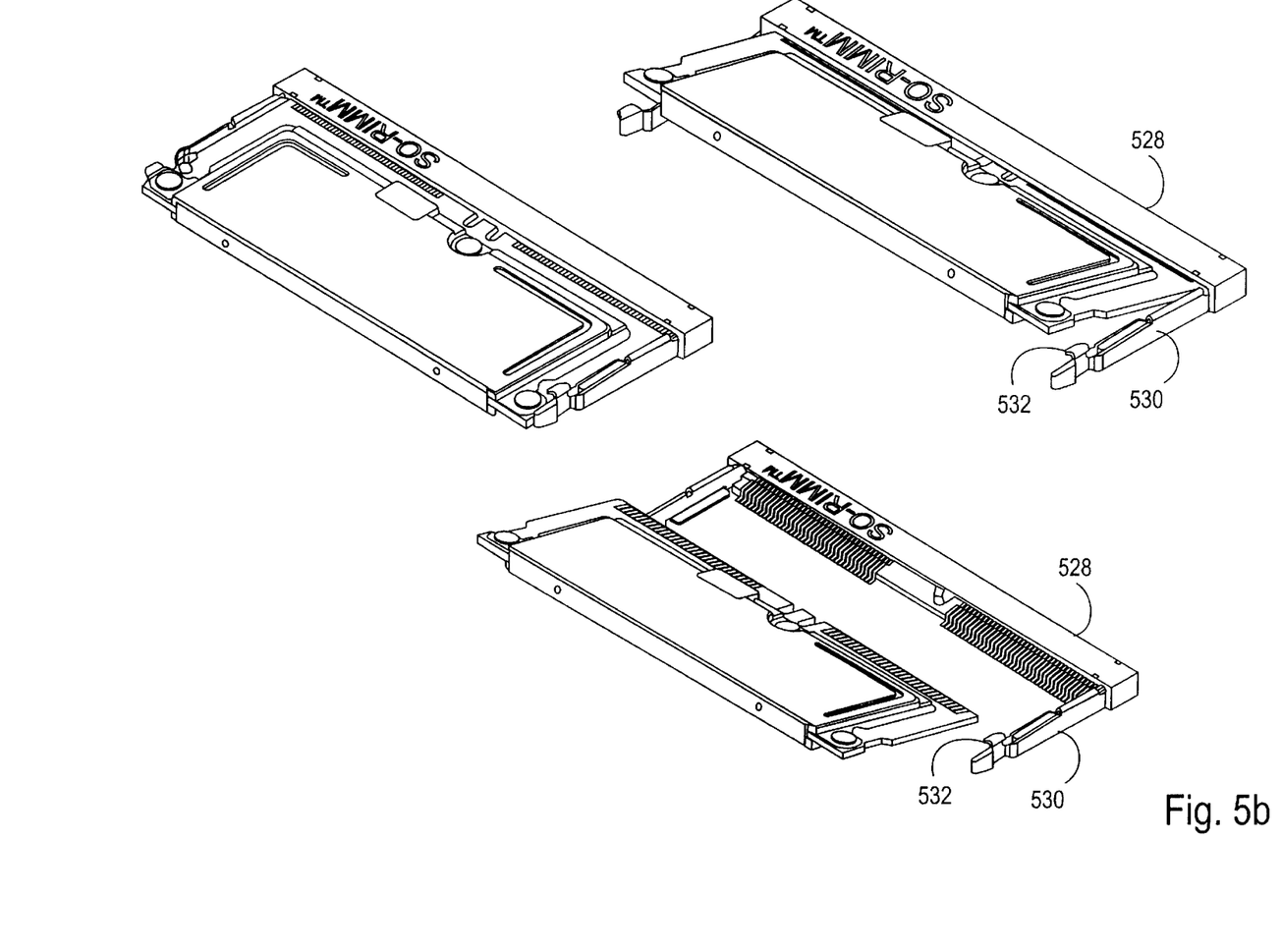

In an alternative embodiment, as illustrated in FIG. 5a, a separate frame 524 may be used to hold the top and bottom covers together. The frame 524 may have an insert receptacle 526 to receive the outer rim 522 of the top and bottom covers, which, in one embodiment, are held in place with friction between the top and bottom covers and the insert receptacle of the frame.

Use of the separate frame 524 provides several advantages. For example, in one embodiment, the frame 524 includes additional structural features to secure the circuit board in connection with the mother board. More specifically, as illustrated in FIG. 5a, a mother board may include a module connector 528 that includes protruding arms 530 that extend outward from the module connector to receive and secure the module. The arms are typically spring biased inward. In one embodiment, the arms are pulled outward to receive the memory module in the connector for attachment to the mother board.

The arms of the connector typically include notches 532 that are typically received by grooves in the memory module circuit board. However, such technique presents disadvantages. Placing the grooves on the circuit board requires further interdependencies between the circuit board and the module connectors. For example, if the grooves of the circuit board are not properly aligned with the notches in the arms of the connectors, the circuit board may need to be discarded. As a result, in one embodiment, the separate frame 524 includes grooves in the outer edge that correspond to the notches of the connector. Therefore, if the grooves of the frame are not aligned with the notches of the connectors, only the frame need be discarded.

In addition, the separate frame 524 further provides additional surface area to receive attachments to thermal solutions external to the packaging cover. For example, as illustrated in FIG. 5a, the separate frame 524 may include apertures 525 (e.g., threads) to interconnect the frame to an external system-level thermal plate solution, to dissipate heat generated by the chips.

Figure 6:
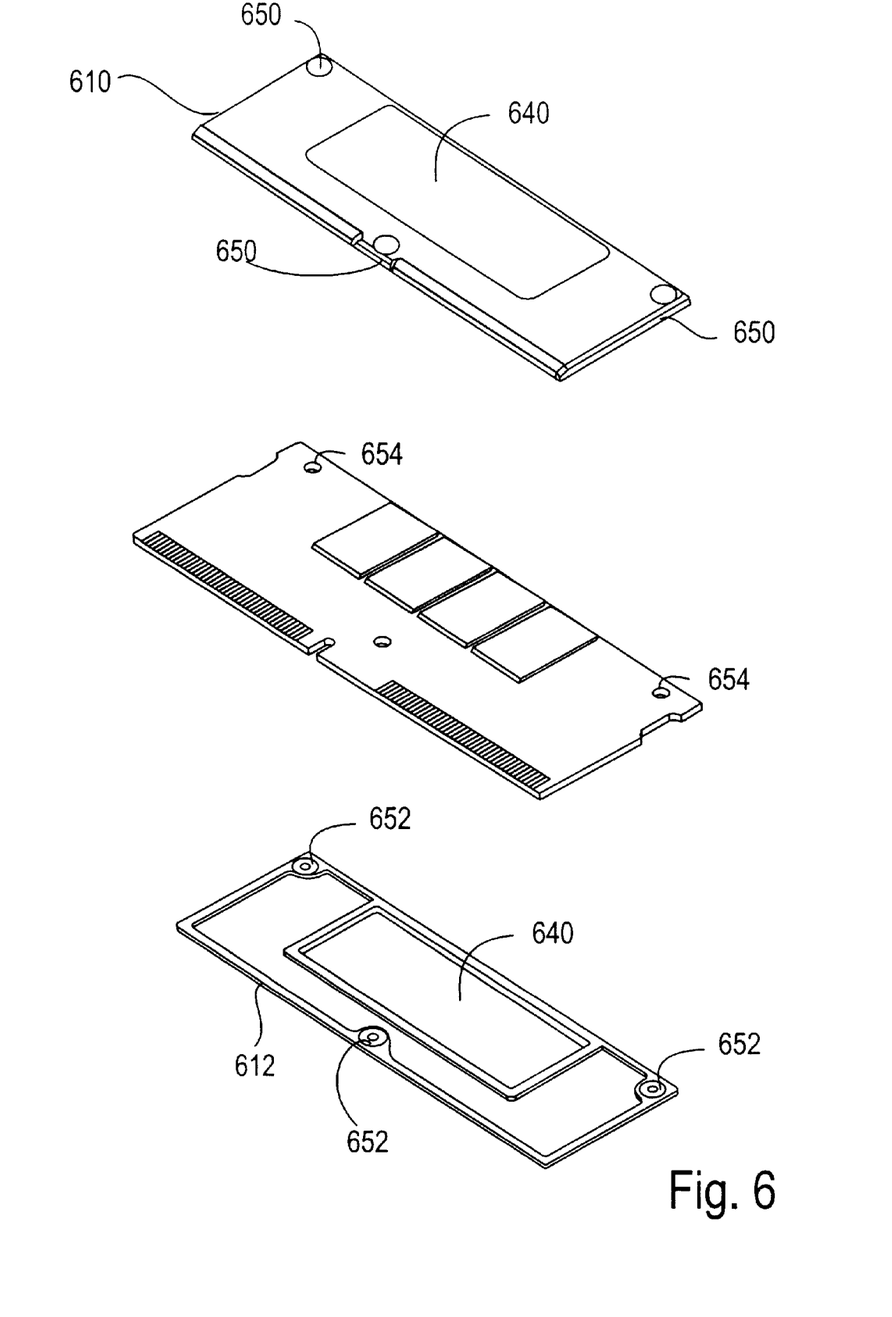
FIG. 6 illustrates an alternative method for attaching top and bottom covers according to one embodiment of the present invention.

In yet another alternative embodiment, as illustrated in FIG. 6, one or more press fit insert pins 650 may be attached to one cover and inserted into corresponding insert receptacles 652 of the opposing cover, to attach the top and bottom covers. The press fit insert pins 650 may be inserted through a hole 654 on the circuit board and into the corresponding insert receptacle of the opposing cover. The press fit insert pins may operate by being pressed through corresponding insert receptacle with force, and latching over a backside rim of the receptacle, once it has been pushed through the receptacle.

In addition, the press fit pins 650 could alternatively be received/fitted directly into the circuit board. As a result, the use of attaching a cover directly to the circuit board could be used to cover chips displaced only on one side of the circuit board.

Figure 7A:
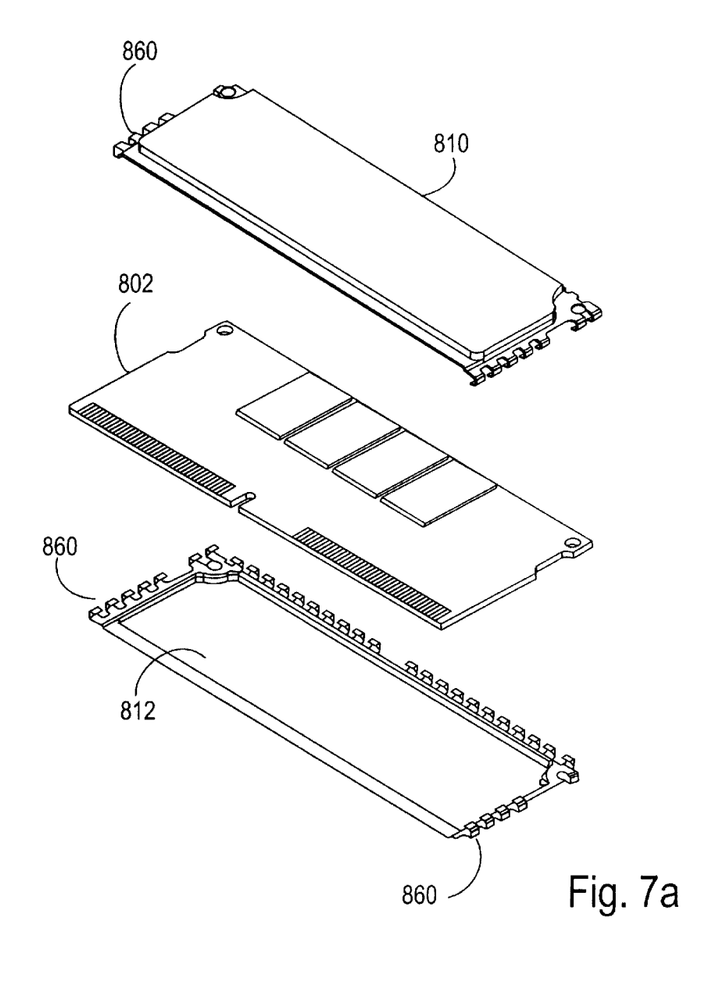
FIGS. 7a–7b illustrate an alternative method for attaching top and bottom covers according to one embodiment of the present invention.

In yet another alternative embodiment, illustrated in FIG. 7a, the rim of the top and/or bottom cover may include multiple fingers 860 integrally formed with the respective cover. Initially, the fingers 860 may extend perpendicularly from the respective cover. As further illustrated in FIG. 7b, when the opposing covers are brought into contact, the fingers of the bottom cover may be bent/folded over of the surface rim of the top cover. The fingers extending from the top cover may also be folded over surface rim of the bottom cover.

Figure 7B:
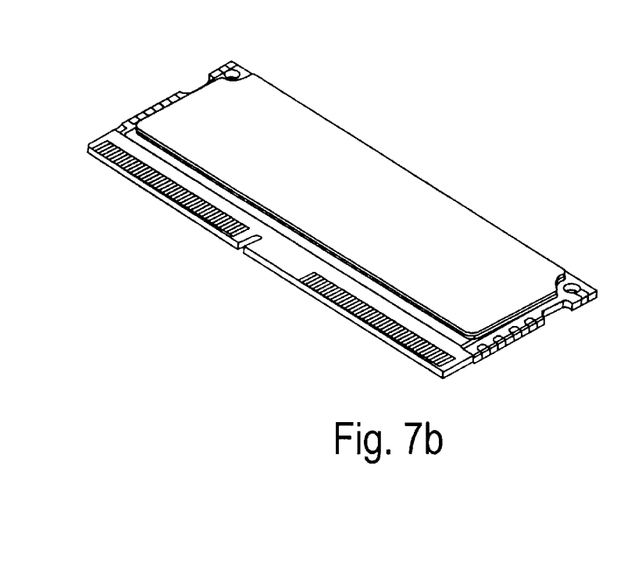

The use of the integral fingers to wrap around the opposing cover further provides additional tolerance in the height of the enclosed board and chips, and additional tolerance for the width and length of the board. More specifically, the length of the fingers that are folded over can vary, with less finger being folded over to allow for a circuit board with increased width (in either direction) and increased height.

Figure 3A:
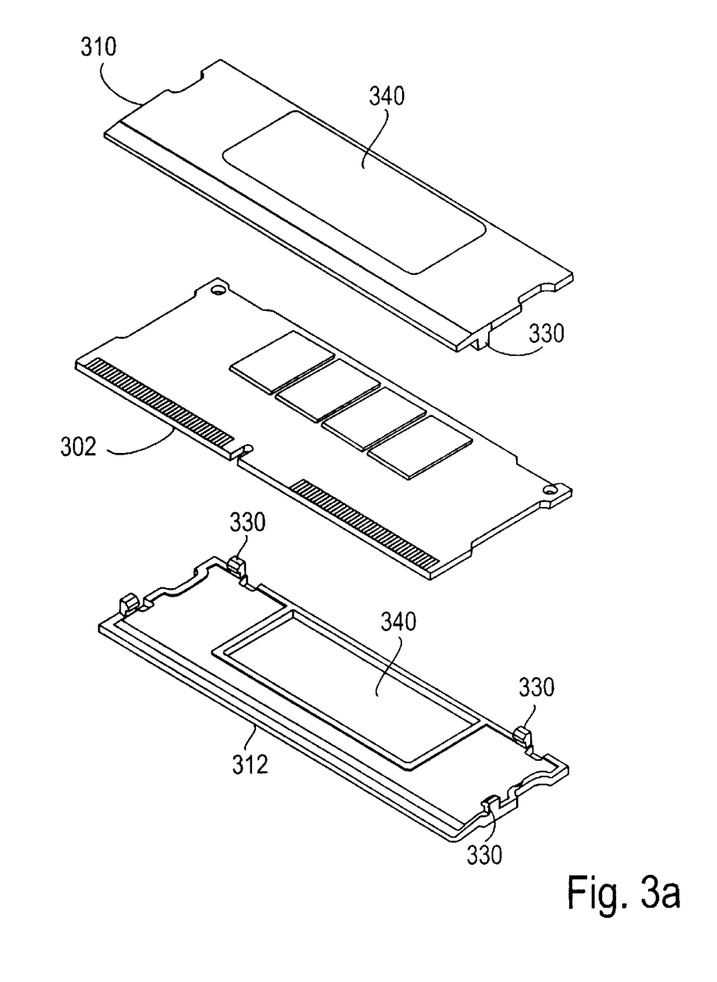
FIGS. 3a–3b illustrate an embodiment using top and bottom covers made of plastic material according to one embodiment of the present invention.
Figure 3B:
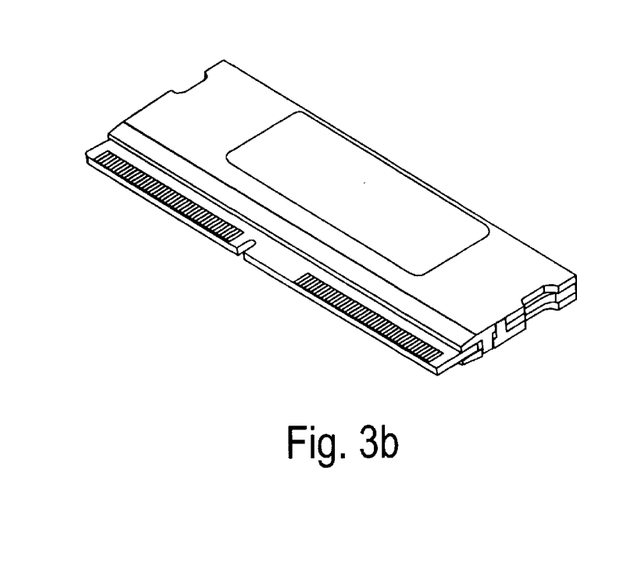

In yet another alternative embodiment, as further illustrated in FIG. 3a, the rim of the top and/or bottom cover may include multiple pressure fitted clip snaps 330 integrally formed with the respective cover. As further illustrated in FIG. 3b, when the opposing covers are brought into contact, the snaps of the bottom cover may be slightly stretched in the horizontal direction, in order to be clasped over the surface rim of the top cover. The snaps extending from the top cover may also be extended/stretched over surface rim of the bottom cover.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A packaging cover to encapsulate a board having multiple separate chips, said separate chips dynamically generating varying amounts of heat, the packaging including a first cover of the packaging cover includes a first set of finger wraps and a second cover of the packaging cover includes a second set of finger wraps that interlace with said first set of finger wraps to secure a coupling between the first cover and a second cover of the packaging cover, and the first cover and second cover of the packaging cover are further assembled with a separate frame to secure a coupling between the first and second covers.

2. The packaging cover of claim 1, wherein the packaging cover provides localized heat dissipation among the multiple separate memory chips.

3. The packaging cover of claim 2, wherein the packaging cover provides a rigid encapsulation of said board having multiple separate memory chips.

4. The packaging cover of claim 1, wherein the packaging cover includes a thermally conductive substance displaced within the packaging cover to conduct heat from the separate chips to the packaging cover.

5. The packaging cover of claim 4, wherein the thermally conductive substance displaced within the packaging cover includes a polymer based gel.

6. The packaging cover of claim 4, wherein the package cover has a height of 3.50 millimeters or less.

7. The packaging cover of claim 4, wherein a top cover and a bottom cover of the package cover include raised areas.

8. The packaging cover of claim 7, wherein said raised areas have a height of at least 1.05±0.05 millimeters.

9. The packaging cover of claim 1, wherein the frame includes grooves to receive notches of a module connector coupled to a motherboard.

10. The packaging cover of claim 9, wherein the frame includes an aperture for receiving connections to thermal solutions external to the packaging cover.

11. The packaging cover of claim 10, wherein the frame further includes an insert receptacle to receive the first and second cover of the packaging cover.

12. A memory module comprising
a packaging cover to encapsulate a board having multiple separate chips, said separate chips dynamically generating varying amounts of heat, the memory module including a first cover of the packaging cover includes a first set of finger wraps and a second cover of the packaging cover includes a second set of finger wraps that interlace with said first set of finger wraps to secure a coupling between the first cover and a second cover of the packaging cover, and the first cover and second cover of the packaging cover are further assembled with a separate frame to secure a coupling between the first and second covers.

13. The memory module of claim 12, wherein the packaging cover provides localized heat dissipation among the multiple separate memory chips.

14. The memory module of claim 13, wherein the packaging cover provides a rigid encapsulation of said board having multiple separate memory chips.

15. The memory module of claim 12, wherein the packaging cover includes a thermally conductive substance displaced within the packaging cover to conduct heat from the separate chips to the packaging cover.

16. The memory module of claim 15, wherein the thermally conductive substance displaced within the packaging cover includes a polymer based gel.

17. The memory module of claim 15, wherein the package cover has a height of 3.50 millimeters or less.

18. The memory module of claim 15, wherein a first cover and a second cover of the package cover include raised areas.

19. The memory module of claim 18, wherein said raised areas have a height of at least 1.05±0.05 millimeters.

20. The memory module of claim 12, wherein the frame includes grooves to receive notches of a module connector coupled to a motherboard.

21. The memory module of claim 20, wherein the frame includes an aperture for receiving connections to thermal solutions external to the packaging cover.

22. The memory module of claim 21, wherein the frame further includes an insert receptacle to receive the first and second cover of the packaging cover.

23. A memory module comprising:
a packaging cover to encapsulate a board having multiple separate chips, said separate chips dynamically generate varying amounts of heat, the packaging cover provides localized heat dissipation among the multiple separate memory chips and further provides a rigid encapsulation of said board, wherein said chips are interconnected to the board via a set of solder balls, and a thermally conductive gel is displaced within the packaging cover;

said packaging cover further includes a top cover and a bottom cover, said top cover and bottom cover each having a raised area, wherein the package cover has a height of 3.50 millimeters or less; and said top cover and bottom cover of the packaging cover are assembled with a separate frame to secure a coupling between the top and bottom covers, wherein the frame includes grooves to receive notches of a module connector coupled to a motherboard, and the top cover of the packaging cover includes a first set of finger wraps and the bottom cover of the packaging cover includes a second set of finger wraps that interlace with said first set of finger wraps to secure a coupling between the top cover and the bottom cover.

* * * * *